United States Patent
Murayama et al.

(10) Patent No.: US 9,648,788 B2
(45) Date of Patent: May 9, 2017

(54) SERVER ROOM MANAGING AIR CONDITIONING SYSTEM

(71) Applicant: Kabushiki Kaisha Toshiba, Minato-Ku, Tokyo (JP)

(72) Inventors: Dai Murayama, Musashino (JP); Yasuo Takagi, Chigasaki (JP); Yuuichi Hanada, Saitama (JP); Hideyoshi Ootani, Chiba (JP); Tomoyuki Kinoshita, Yokohama (JP); Hiroshi Morimoto, Tokyo (JP); Koubun Takahashi, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 231 days.

(21) Appl. No.: 14/677,160

(22) Filed: Apr. 2, 2015

(65) Prior Publication Data
US 2015/0216086 A1    Jul. 30, 2015

Related U.S. Application Data

(60) Division of application No. 13/408,354, filed on Feb. 29, 2012, now Pat. No. 9,307,679, which is a
(Continued)

(30) Foreign Application Priority Data

Mar. 15, 2011  (JP) ................................ 2011-056562

(51) Int. Cl.
*F25D 23/12*    (2006.01)
*F25D 17/06*    (2006.01)
(Continued)

(52) U.S. Cl.
CPC ........... *H05K 7/20836* (2013.01); *F24F 3/14* (2013.01); *F24F 3/1405* (2013.01); *F24F 3/153* (2013.01);
(Continued)

(58) Field of Classification Search
CPC .... F25B 2313/0233; F25B 2313/02333; F24F 3/153; F24F 3/1405; H05K 7/20709;
(Continued)

(56) References Cited

U.S. PATENT DOCUMENTS 4,424,933 A * 1/1984 Sutoh .................... G05D 22/02
                                                              165/224
2010/0307731 A1  12/2010 Yonezawa et al.
2011/0239961 A1  10/2011 Bauver et al.

FOREIGN PATENT DOCUMENTS

CN    101270906 A    9/2008
CN    101440984 A    5/2009
(Continued)

OTHER PUBLICATIONS

International Search Report issued by the Japanese Patent Office on Apr. 17, 2012, for International Patent Application No. PCT/JP2012/050909.

*Primary Examiner* — Marc Norman
*Assistant Examiner* — Daniel C Comings
(74) *Attorney, Agent, or Firm* — Finnegan, Henderson, Farabow, Garrett & Dunner, LLP

(57) ABSTRACT

In accordance with embodiments, a server room managing air conditioning system includes: a first coil; a second coil; and an air supply fan. The first coil adjusts returned air of a server room to a predetermined temperature value lower than a supplied air temperature target value and dehumidifies the returned air. The second coil adjusts the returned air of the server room to a predetermined temperature value higher than the supplied air temperature target value so that the supplied air temperature target value and a supplied air humidity target value can be achieved when the returned air is mixed with air adjusted by the first coil. The air supply fan
(Continued)

mixes the returned air and supplies the mixed returned air as the supplied air to the server room.

4 Claims, 10 Drawing Sheets

Related U.S. Application Data continuation of application No. PCT/JP2012/050909, filed on Jan. 18, 2012.

(51) Int. Cl.
| | |
|---|---|
| F25D 17/04 | (2006.01) |
| F25B 49/00 | (2006.01) |
| F25D 21/00 | (2006.01) |
| F25B 47/00 | (2006.01) |
| H05K 7/20 | (2006.01) |
| F24F 3/14 | (2006.01) |
| F24F 3/153 | (2006.01) |
| G05D 23/19 | (2006.01) |
| G05D 22/02 | (2006.01) |
| G05D 27/02 | (2006.01) |
| F28F 27/00 | (2006.01) |

(52) U.S. Cl.
CPC ............ *F28F 27/00* (2013.01); *G05D 22/02* (2013.01); *G05D 23/193* (2013.01); *G05D 23/1931* (2013.01); *G05D 27/02* (2013.01); *H05K 7/20709* (2013.01); *H05K 7/20718* (2013.01); *H05K 7/20745* (2013.01)

(58) Field of Classification Search
CPC .... H05K 7/20718; G05D 22/00; G05D 22/02; G05D 23/1927; G05D 23/193; G05D 23/1931; G05D 27/02
USPC ............... 62/93, 176.6, 259.2, 272, 277
See application file for complete search history.

(56) References Cited

FOREIGN PATENT DOCUMENTS

| | | |
|---|---|---|
| CN | 101925786 A | 12/2010 |
| JP | 2006-284175 | 10/2006 |
| JP | 2007-78261 | 3/2007 |
| JP | 2007-120775 | 5/2007 |
| JP | 2010-2069 | 1/2010 |
| JP | 2010-7954 | 1/2010 |
| JP | 4503083 | 4/2010 |
| JP | 2010-266085 | 11/2010 |

* cited by examiner

SERVER ROOM MANAGING AIR CONDITIONING SYSTEM

CROSS-REFERENCE TO RELATED APPLICATION

This application is a divisional application of application Ser. No. 13/408,354, filed on Feb. 29, 2015, which is a Continuation of PCT Application No. PCT/JP2012/50909, filed on Jan. 18, 2012, and claims the priority of Japanese Patent Application No. 2011-056562, filed on Mar. 15, 2011, the contents of all of which are incorporated herein by reference.

TECHNICAL FIELD

Embodiments of the present invention relate to a server room managing air conditioning system.

BACKGROUND ART

In general, in a server room managing air conditioning control apparatus, there is performed air conditioning by temperature/humidity adjustment based on conditions where a mechanism similar to that oriented for a general building is provided, and airflow on the peripheries of information instruments is optimized, and so on, whereby achievement of energy saving enhancement is widely performed.

In recent years, an information amount has been increased by popularization of the Internet, and the like, whereby data centers, each of which is provided with such a server room, have been built more, and enhancement of energy saving performance of these facilities has been widely regarded as a subject.

In the case where loads to be subjected to air conditioning are information instruments as in such a data center, there are features different from those in air conditioning control oriented for the general building, such that most of the loads are sensible heat loads, that setting temperature/humidity just need to be within fixed ranges, and that ventilation for preventing an increase of a CO2 concentration is unnecessary since CO2 is not generated in the loads.

Accordingly, there is a technology for performing air conditioning in such a manner that, the data center is composed to be partitioned into two spaces, which are an air supply-side space (cold area) to servers and an air discharge-side space (hot area) therefrom, that returned air from an inside of the server room is taken in and subjected to temperature control, and that the air is circulated so as to be supplied again into such a room inside.

With such a configuration, a temperature gradient in an area of the room inside is reduced, and in addition, variations of an air supply temperature are reduced, whereby air conditioning control with a high energy-saving effect and good efficiency can be performed.

CITATION LIST

Patent Literature

[PTL 1]
Japanese Patent No. 4503083

SUMMARY OF INVENTION

Technical Problem

However, even in the case of performing the sir conditioning while taking in and circulating the returned air from the server room as mentioned above, outside air with high absolute humidity sometimes enters the room inside from a gap during an operation oil the servers, and vapor is sometimes generated from expiration of a person since the person temporarily stays in the room inside, whereby absolute humidity of the server room to be subjected to the air conditioning control sometimes rises.

The present invention has been made in consideration of the above-described circumstances. It is an object of the present invention to provide a server room managing air conditioning system that controls such a control target inside of the server room to keep appropriate humidity in the event of executing the air conditioning control by performing the air control for the returned air in the inside of the server room and by circulating the air so that the air can be supplied again into the room inside.

Solution to Problem

In accordance with embodiments for achieving the foregoing object, a server room managing air conditioning system includes: a first coil; a second coil; and an air supply fan. The first coil adjusts returned air of a server room to a predetermined temperature value lower than a supplied air temperature target value and dehumidifies the returned air. The second coil is installed in a same area as an area of the first coil, and adjusts the returned air of the server room to a predetermined temperature value higher than the supplied air temperature target value so that the supplied air temperature target value and a supplied air humidity target value can be achieved when the returned air is mixed with air adjusted by the first coil. The air supply fan mixes the returned air adjusted by the first coil and the returned air adjusted by the second call with each other and supplies the mixed returned air as the supplied air to the server room.

BRIEF DESCRIPTION OF DRAWINGS

FIG. 9(a) shows a change or a supplied air absolute humidity value; FIG. 9(b) shows a change of a supplied air temperature value; and FIG. 9(c) shows an ON/OFF switching state of humidity control.

FIG. 11(a) shows a change of a supplied air absolute humidity value; and FIG. 11(b) shows a change of a supplied air temperature value.

DESCRIPTION OF EMBODIMENTS

First Embodiment (Configuration of Server Room Managing Air Conditioning System According to First Embodiment)

Figure 1:
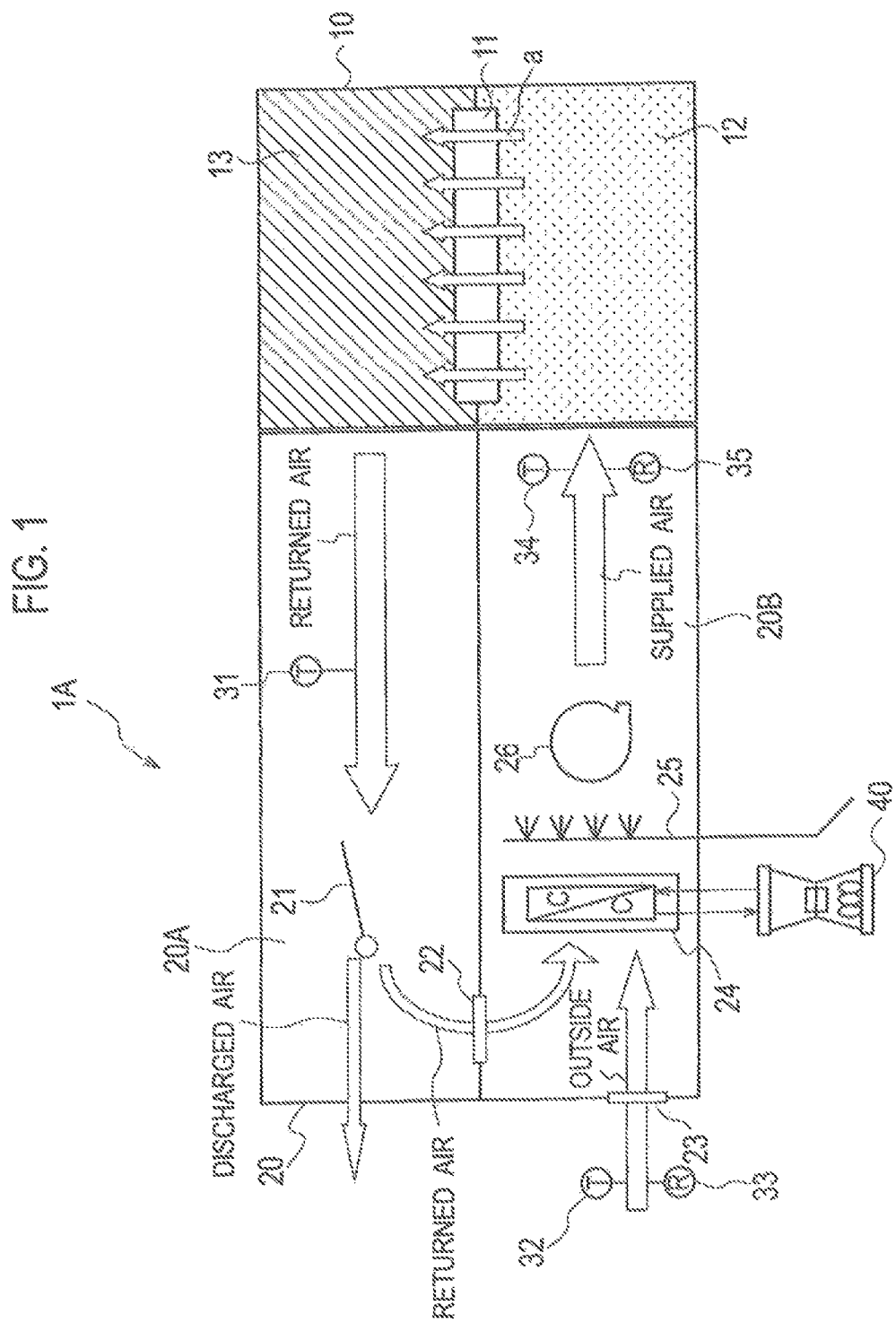
FIG. 1 is an overall view showing a configuration of an air conditioning system according to a first embodiment.

A description is made of a configuration of a server room managing air conditioning system 1A according to a first embodiment of the present invention with reference to FIG. 1.

The air conditioning system 1A according to this embodiment performs air conditioning for a server room 10 of a data center or the like. An inside of the server room 10 is separated into a cold area 12 as a first space and a hot area 13 as a second space, and a server rack 11, in which a plurality of servers (not shown) are housed, is installed between the cold area 12 and the hot area 13.

Then, by operations of fans (not shown) in the servers housed in this server rack 11, as shown by arrows a, cold air supplied from an indoor unit 20 to the cold area 12 is sucked into the servers of the server rack 11, and airflow is generated so that the air supplied to the servers can be flown out, to the hot area 13, as returned air heated by heat generation of the servers. Then, in the servers, heat generated therein is cooled by the cold air sucked thereinto, and the servers become normally operable.

The air conditioning system 1A includes: the indoor unit 20; and an outdoor unit group 40.

The indoor unit 20 includes: a returned air introduction area 20A connected to the hot area 13 of the server room 10; and a supplied air cooling area 20B connected to the cold area 12 of the server room 10, in which a discharging damper 21 is installed in the returned air introduction area 20A, a returned air introducing damper 22 is installed between the returned air introduction area 20A and the supplied air cooling area 20B, and in the supplied air cooling area 20B, there are installed an outside air introducing damper 23, a cooling coil group 24 as a cold air generation device, a humidifier 25, and an air supply fan 26.

The discharging damper 21 adjusts, by an opening degree thereof, an amount of returned air that flows from the hot area 13 of the server room 10 into the returned air introduction area 20A and is discharged to the outside.

The returned air introducing damper 22 adjusts, by an opening degree thereof, a volume of the returned air introduced from the returned air introduction area 20A to the supplied air cooling area 20B.

The outside air introducing damper 23 adjusts, by an opening degree thereof, a volume of the outside air introduced from the outside into the supplied air cooling area 20B.

The cooling coil group 24 is composed of a plurality of cooling coils. According to needs, the cooling coil group 24 cools the outside air, which is introduced thereinto when the outside air introducing damper 23 is turned to an open state, and the returned air introduced thereinto from the returned air introduction area 20A when the returned air introducing damper 22 is turned to an open state, thereby generating the cold air.

According to needs, the humidifier 25 humidifies the outside air and the returned air, which are introduced thereinto.

The air supply fan 26 flows the cold air, which is generated by being cooled by the cooling coil group 24 according to needs and by being humidified by the humidifier 25 according to needs, as supplied air into the cold area 12 in the server room 10.

Moreover, in the returned air introduction area 20A, a returned air thermometer 31, which measures temperature of the returned air flown thereinto from the hot area 13, is installed. On the outside of the indoor unit 20, there are installed: an outside air thermometer 32 that measures temperature of the outside air; and an outside air hygrometer 33 that measures humidity of the outside air. Downstream of the air supply fan 26 in the supplied air cooling area 20B, there are installed: a supplied air thermometer 34 that measures temperature of the supplied air flown into the cold area 12 of the server room 10; and a supplied air hygrometer 35 that measures humidity of the supplied air thus flown thereinto.

The outside unit group 40 is composed of a plurality of outside units. The plurality of outside units are individually connected to the plurality of cooling coils of the cooling coil group 24, and supply thereto a refrigerant for use in the event of generating the cold air in the respective cooling coils.

Figure 2:
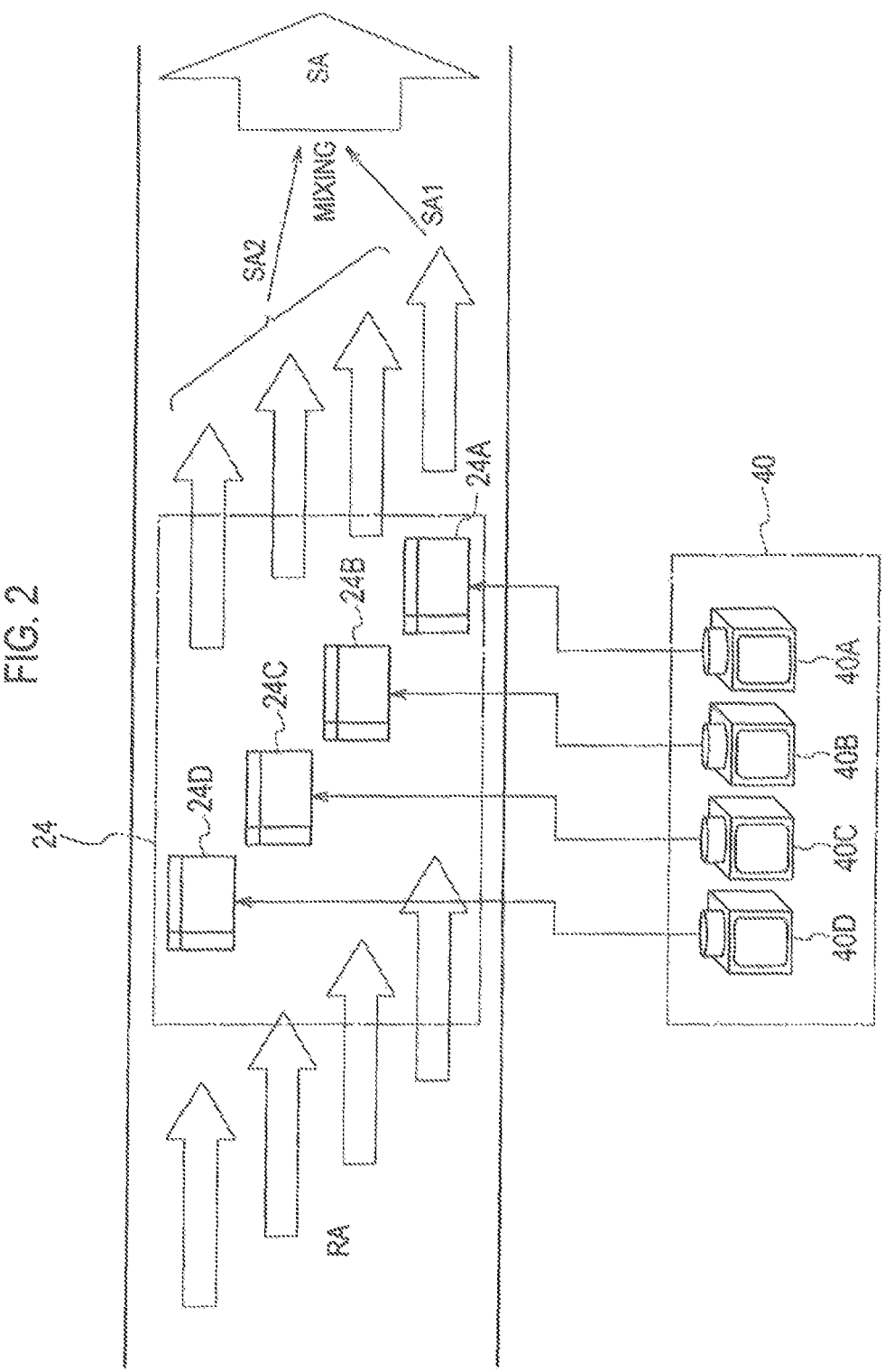
FIG. 2 is an explanatory view showing configurations of a cooling coil group and outdoor units in the air conditioning system according to the first embodiment.

A description is made of detailed configurations of the cooling coil group 24 and the outside unit 40 with reference to FIG. 2. In this embodiment, the cooling coil group 24 is composed of four cooling coils 24A to 24D, the outside unit group 40 is composed of four outside units 40A to 40D, and the cooling coils and the outside units are connected to each other by ducts in a one-to-one relationship. The cooling coils 24A to 24D are installed in the supplied air cooling area 20B. Note that, suitably, the cooling coils 24A to 24D are installed so as not to longitudinally overlap one another in a direction of 90 degrees with respect to a flowing direction of the taken-in returned air; however, an angle of the direction concerned is not limited to 90 degrees.

(Operations of Server Room Managing Air Conditioning System According to First Embodiment)

Next, a description is made of operations of the server room managing air conditioning system 1A according to this embodiment.

For the purpose of appropriately cooling the servers installed in the server rack 11, the air conditioning system 1A in this embodiment is operated: (1) so that the cold air (supplied air supplied from the indoor unit 20 to the server room 10) sucked by the fans in the servers can satisfy predetermined conditions; and (2) so that the fans in the servers can surely suck the cold air in the cold area and blow out the cold air to the not area.

Between these, the conditions for the air supply in (1) are determined in response to a request from the installed servers. In this embodiment, conditions, where temperature ranges from 18 to 27° C., absolute humidity ranges from 0.0056 to 0.0107 kg/kg, and relative humidity is 60% or less, are set in conformity with regulations of ASHRAE (American Society of Heating, Refrigerating and Air-Conditioning Engineers) or with regulations similar thereto.

Figure 3:
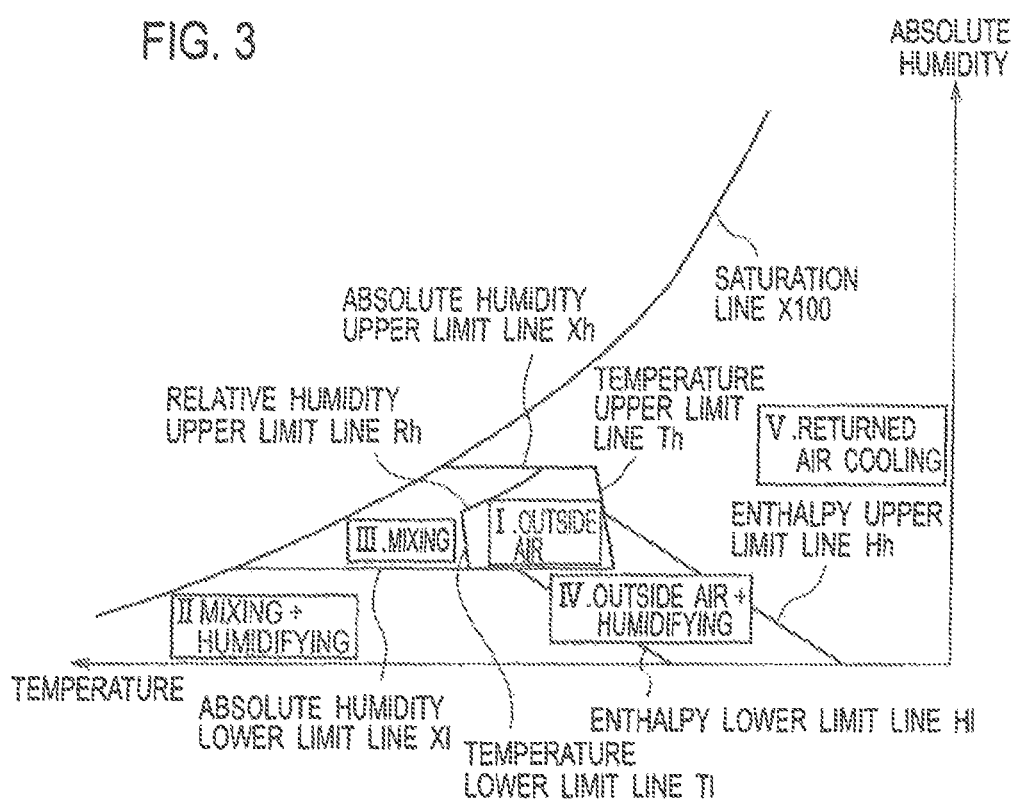
FIG. 3 is an air diagram for classifying states of outside air in events of using air conditioning systems according to first to fourth embodiments.

In the case where a supplied air temperature target range and a supplied air humidity target range are set as described above, a state of the outside air at present is determined depending on to which region on an air diagram divided as shown in FIG. 3 the outside air concerned applies. The air diagram refers to a diagram that makes it possible to understand thereon a state of humidified air based on the temperature, the absolute/relative humidity, enthalpy, and the like.

In the air diagram of FIG. 3, a state of air with relative humidity of 100% (saturated state) or less is divided into regions I to V, which represent five air state ranges to be shown below, based on values indicated by the above-mentioned supplied air temperature target range and the supplied air humidity target range, and on an upper limit value and lower limit value of enthalpy corresponding to an air state within a range that applies to the supplied air temperature target range and the supplied air humidity target range. In this embodiment, it is defined that such an enthalpy upper limit value corresponding to the above-mentioned supplied air temperature target range and supplied air humidity target range is 50 kJ/kg (DA), and that such an enthalpy lower limit value corresponding thereto is 35 kJ/kg (DA).

Region I (First Air State Range):

The region I is the supplied air temperature target range, and the supplied, air absolute humidity range taken as the target, and a range similar to the supplied air relative humidity range, that is, a range that satisfies the following Expression (1) on the air diagram.

[Math. 1]

(temperature: 18° C. or more to 27° C. or less)

∩ (absolute humidity: 0.0056 kg/kg (DA) or more to 0.0107 kg/kg (DA) or less)

∩ (relative humidity: 60% or less)   Expression (1)

Region II (Second Air State Range):

The region II is a range less than a lower limit value of the supplied air absolute humidity range taken as the target, and a range less than the enthalpy lower limit value in the range taken as the target, that is, a range that satisfies the following Expression (2) on the air diagram.

[Math. 2]

(absolute humidity: less than 0.0056 kg/kg (DA))

∩ (relative enthalpy: less than 35 kJ/kg (DA))   Expression (2)

Region III (Third Air State Range):

The region III is a range within the supplied air absolute humidity taken as the target, and a range less than the lower limit value of the supplied air temperature range taken as the target or equal to or more than the upper limit value of the supplied air relative humidity taken as the target, that is, a range that satisfies the following Expression (3) on the air diagram.

[Math. 3]

(absolute humidity: 0.0056 kg/kg (DA) or more to 0.0107 kg/kg (DA) or less)

∩ ((temperature: less than 19° C.) ∪ (relative humidity: 60% or more)   Expression (3)

Region IV (Fourth Air State Range):

The region IV is a range within an enthalpy range corresponding to the ranges of the supplied air temperature and the supplied air humidity, which are taken as the targets, and a range less than the lower limit value of the supplied air absolute humidity range taken as the target or exceeding the upper limit value of the supplied air temperature range taken as the target, that is, a range that satisfies the following Expression (4) on the air diagram.

[Math. 4]

(relative enthalpy: 35 kJ/kg (DA) or more to 50 kJ/kg (DA) or less)

∩ ((absolute humidity: less than 0.0056 kg/kg (DA)) ∪ (temperature: exceeding 27° C.)   Expression (4)

Region V (Fifth Air State Range):

The region V is a range other than the above-described regions I to IV.

When it is determined that the state of the outside air at present applies to any of these regions I to IV, air conditioning control contents can be set as follows for each of the regions. The setting contents are decided on the assumption that subjects of the air conditioning control are sensible heat loads by neat generated from the servers in the server room 10, and latent heat loads by expiration of persons, and the like are not generated, and that a returned air humidity vale is the same as a supplied air humidity measurement value measured by the supplied air hygrometer 35.

Air conditioning control contents in case where outside air state applies to region I:

When the state of the outside air at present is within the region I, the state concerned applies to the above-mentioned supplied air temperature target range and supplied air humidity target range, and it is possible to directly use the outside air as the supplied air. Therefore, the discharging damper 21 is fully opened, the returned air introducing damper 22 is closed, and the outside air introducing damper 23 is fully opened, whereby the control contents are decided so that an outside air introduction ratio can be 100%. Moreover, at this time, humidifying treatment by the humidifier 25 and cooling treatment for mixed air by the cooling coil group 24 are not performed.

Air conditioning control contents in case where outside air state applies to region II:

When the state of the outside air at present is within the region II, the control contents are decided so that temperature of the outside air can be raised by mixing the returned air with the outside air and that the outside air can be humidified thereby. Specifically, the control contents are decided so that the opening degrees of the discharging damper 21, the returned air introducing damper 22 and the outside air introducing damper 23 can be adjusted between 0 and 100% in response to the outside air introduction ratio, and that a necessary amount of humidification can be performed by the humidifier 25.

At this time, a target value α of the outside air introduction ratio is adjusted by an outside air temperature measurement value and a returned air temperature measurement value so that air after such mixing can reach a supplied air temperature target value preset within the supplied air temperature target range and the supplied air humidity target range.

When an outside air absolute humidity measurement value Xo, a returned air absolute humidity measurement value Xr and the outside air introduction ratio target value α are used, then an absolute humidity value X of the air in which the outside air introduction ratio is adjusted and the outside air and the returned air are mixed with each other as described above is represented as in the following Expression (5).

[Math. 5]

$$X = Xo \times \alpha + Xr \times (1-\alpha) \quad \text{Expression (5)}$$

Therefore, in order to turn the mixed air into the supplied air in the target temperature/humidity state, humidification by an amount of Xs0−X as a difference thereof from a supplied air absolute humidity target value Xs0 is necessary. When a supplied air flow rate Fs is used, a necessary amount of the humidification for increasing a humidity value as this difference is represented as Fs×(Xs0−X), and control contents of a valve (not shown) for controlling a quantity of water of the humidifier are decided so that this necessary amount of humidification can be supplied. At this time, the cooling treatment for the mixed air by the cooling coil group 24 is not performed.

Note that, though the necessary amount of humidification in the event of performing the humidification after the mixing of the outside air and the returned air is decided as described above, it is also possible to make it unnecessary to perform the humidification after the mining concerned in such a manner that the returned air is humidified in advance so as to achieve the absolute humidity target value of (Xr+(X−Xs0/(1−α).

In this case, the outside air introduction ratio target value α is represented by the following Expression (6) where the outside air temperature measurement value is To, the returned air temperature value after the humidification is Tr2, and the supplied air temperature target value is Ts0.

[Math. 6]

$$\alpha = (Tr2 - Ts0)/(Tr2 - To) \times 100(\%) \quad \text{Expression (6)}$$

Air conditioning control contents in case where outside air state applies to region III:

When the state of the outside air at present is within the region III, the control contents are decided so that the temperature of the outside air can be raised by missing the returned air with the outside air. Specifically, the control contents are decided so that the opening degrees of the discharging damper 21, the returned air introducing damper 22 and the outside air introducing damper 23 can be adjusted between 0 and 100% in response to the outside air introduction ratio.

In this case, the outside air introduction ratio target value tx is represented by the following Expression (7) where the outside air temperature measurement value is To, the returned air temperature measurement value is Tr, and the supplied air temperature target value is Ts0.

[Math. 7]

$$\alpha = (Tr - Ts0)/(Tr - To) \times 100(\%) \quad \text{Expression (7)}$$

At this time, the humidifying treatment by the humidifier 25 and the cooling treatment for the mixed air by the cooling coil group 24 are not performed.

Air conditioning control contents in case where outside air state applies to region IV:

When the state of the outside air at present is within the region IV, the control contents are decided so as to perform the humidification for the outside air. Specifically, the discharging damper 21 is fully opened, the returned air introducing damper 22 is closed, and the outside air introducing damper 23 is fully opened, whereby the control contents are decided so that the outside air introduction ratio can be set at 100%, and that the necessary amount of humidification can be performed by the humidifier 25.

In this case, when the outside air absolute humidity measurement value is Xo, and the supplied air humidity target value is Xs0, then the necessary amount of humidification is Xs0−Xo. At this time, the outside air temperature drops from To to T following the humidification. In the case where the supplied air temperature target value Ts0 is lower than T, the control is performed so that the cooling treatment can be performed by the cooling coil group 24 so that the outside air can reach the supplied air temperature target value.

Air conditioning control contents in case where outside air state applies to region V:

When the state of the outside air at present is within the region V, the control contents are decided so as to cool the returned air. Specifically, the discharging damper 21 is closed, the returned air introducing damper 22 is fully opened, and the outside air introducing damper 23 is closed, whereby the control contents are decided so that the outside air introduction ratio can be set at 0%, and that cooling/dehumidification treatment can be performed by the cooling coil group 24. At this time, the humidification treatment by the humidifier 25 is not performed.

When the air conditioning control contents are set as mentioned above, then based on these, the control is performed for the opening degrees of the discharging damper 21, the returned air introducing damper 22 and the outside air introducing damper 23, the control amounts of the humidifier 25 and the cooling coil group 24, and the number of revolutions of the air supply fan 26, the air supply is controlled at the supplied air temperature value and the supplied air humidity value within the target ranges, and appropriate air conditioning is performed.

Among such types of the air conditioning control as mentioned above, in the event where the state of the outside air at present is determined to be within the range of the region V, and the outside air is not introduced but the supplied air is generated entirely by the returned air, whereby the air conditioning for the server room 10 is performed, (hereinafter, referred to as an "all circulation mode"), the returned air (RA) in the hot area 13 of the server room 10 is introduced into the returned air introduction area 20A, and is taken into the supplied air cooling area 20B in such a manner that the returned air introducing damper 22 is turned to the open state. Then, the returned air is cooled by the cooling coil group 24 and is humidified by the humidifier 25 according to needs, and is supplied as the supplied air (SA) by the cooling fan 26 to the cold area 12 of the server room 10.

Figure 4:
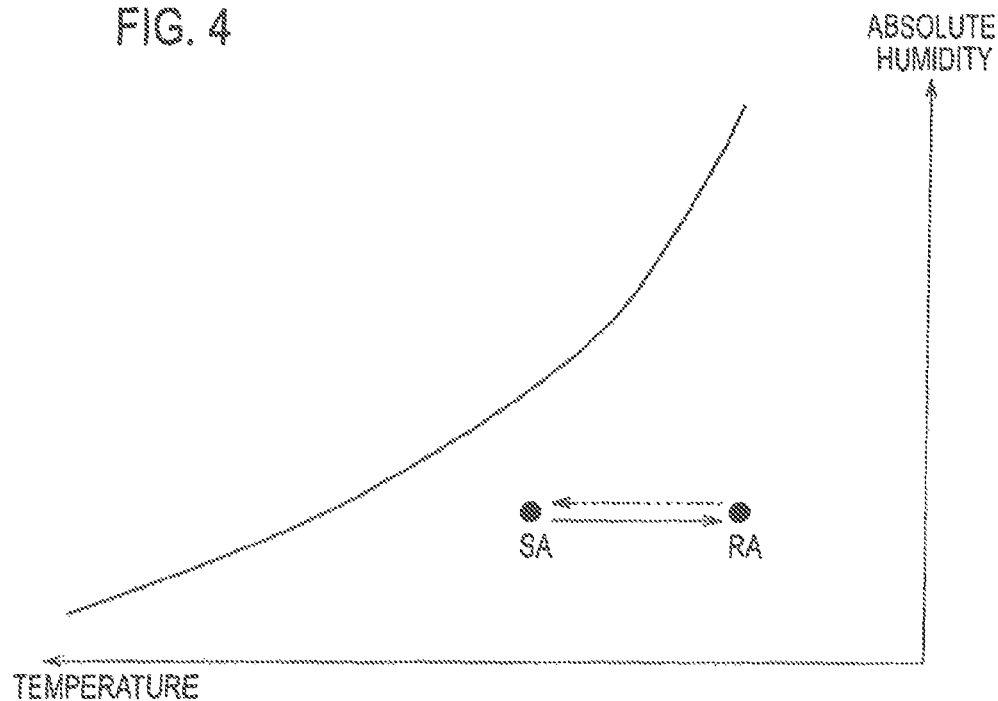
FIG. 4 is a graph showing a relationship between returned air temperature and supplied air temperature in a case where air conditioning is performed in an all circulation mode in a conventional air conditioning system.

At this time, in the server room 10, the latent heat loads are not generated though the sensible heat loads are generated. Accordingly, as shown in FIG. 4, the returned air (RA) from the server room 10 and the supplied air (SA) to the server room 10 are the same in absolute humidity value and different from each other only in temperature value.

However, in actual, the absolute humidity of the server room as the air conditioning control subject sometimes rises owing to such unexpected events that outside air with high humidity enters from the outside air introducing damper 23, gaps of the cold area 12 and the hot area 13, and the like, and that a person temporarily stays in the room inside to thereby generate vapor from expiration thereof.

Figure 5:
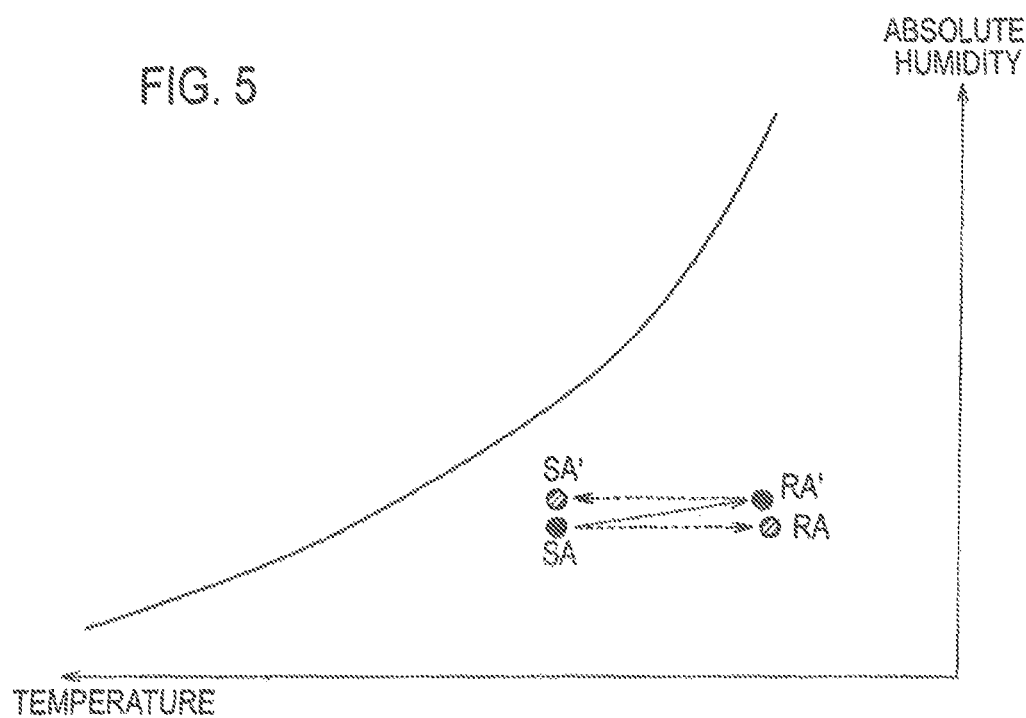
FIG. 5 is a graph showing a relationship between the returned air temperature and the supplied air temperature in a case where the air conditioning is performed in the all circulation mode in the conventional air conditioning system and outside air enters the same.

In this case, as shown in FIG. 5, returned air (RA') with humidity higher than in the supplied air (SA) supplied to the server room 10 is acquired in the indoor unit 20, and supplied air (SA') generated by this returned air also becomes air with high humidity under the all circulation mode.

In order to prevent the humidity of the returned air from the server room 10 and the humidity of the supplied air to the server 10 from gradually rising and going out of the appropriate supplied air humidity target range by the fact that such a state is repeated, an amount of rise of the absolute humidity value in the server room 10, which may rise by the entrance of the outside air with high humidity from the gaps and the like, such temporal entrance of an administrator into the room, and the like, is estimated in advance. Then, in response to this, the cooling coils 24A to 240 of the cooling coil group 24 installed in the supplied air cooling area 20B are set separately for those to be operated for adjusting the humidity and for those to be operated for adjusting the temperature.

Figure 6:
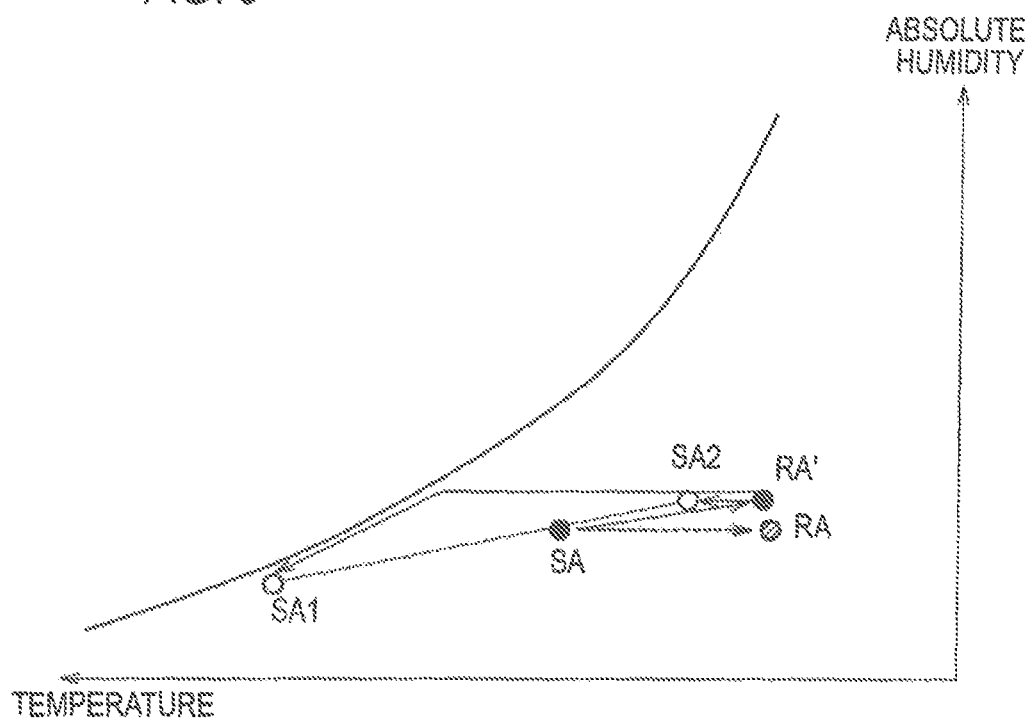
FIG. 6 is a graph showing a relationship between the returned air temperature and the supplied air temperature in a case where the air conditioning is performed by humidity control and temperature control in the air conditioning systems according to the first to fourth embodiments.

In this embodiment, in the cooling coil group 24 shown in FIG. 2, the cooling coil 24A is set so as to operate as a first coil for adjusting the humidity, and prepares supplied air (SA1) in which the returned air (RA') with the raised humidity, the returned air (RA') being taken in from the returned air introduction area 20A, is cooled down to temperature that is lower than the supplied air temperature target value (SA) as shown in FIG. 6 and enables the humidification. The outdoor unit 40A supplies a refrigerant of temperature and amount for performing air conditioning to lower the temperature in the cooling coil 24A from the temperature of the returned air (RA') to the temperature of the supplied air (SA1).

Moreover, in the cooling coil group 24, three cooling coils 24B to 24D are set so as to operate as second coils for adjusting the temperature, and prepare supplied air (SA2) in which the returned air (RA') taken in from the returned air introduction area 20A is cooled down to temperature higher than the supplied air temperature target value (SA) as shown in FIG. 6. The temperature of this supplied air (SA2) has a value decided so that the supplied air temperature target value and the supplied air humidity target value can be achieved at the time of mixing the air prepared by the cooling coil 24A and the air prepared by the cooling coils 24B to 24D with each other. The outdoor units 40B to 40D supply the refrigerant of the temperature and the amount for performing the air conditioning to lower the temperature in the cooling coils 24B to 24D from the temperature of the returned air (RA') to the temperature of the supplied air (SA2). The humidity adjustment is not performed in these cooling coils 24B to 24D.

When the humidity adjustment and the temperature adjustment for the taken-in returned air are performed for the flow of the returned air by the cooling coils 24A to 24D as described above, the supplied air already adjusted by the respective cooling coils 24A to 24D is naturally mixed together in the supplied air cooling area 20B, and the supplied air (SA) with the supplied air temperature target value and the supplied air humidity target value is obtained, and is then supplied to the cold area 12 of the server room 10 by the air supply fan 26.

In accordance with this embodiment described above, in the event where the air conditioning control for the server room is performed in the all circulation mode, in the case where the amount of rise of the absolute humidity in the server room owing to the unexpected events can be estimated in advance, the cooling coil for the humidity control and the cooling coils for the temperature control, in which the number and the control amounts are decided in response to such estimation, are installed in the supplied air cooling area as the same space, whereby the supplied air with the target temperature value and the target humidity value can be supplied to the server room.

Second Embodiment (Configuration of Server Room Managing Air Conditioning System According to Second Embodiment)

Figure 7:
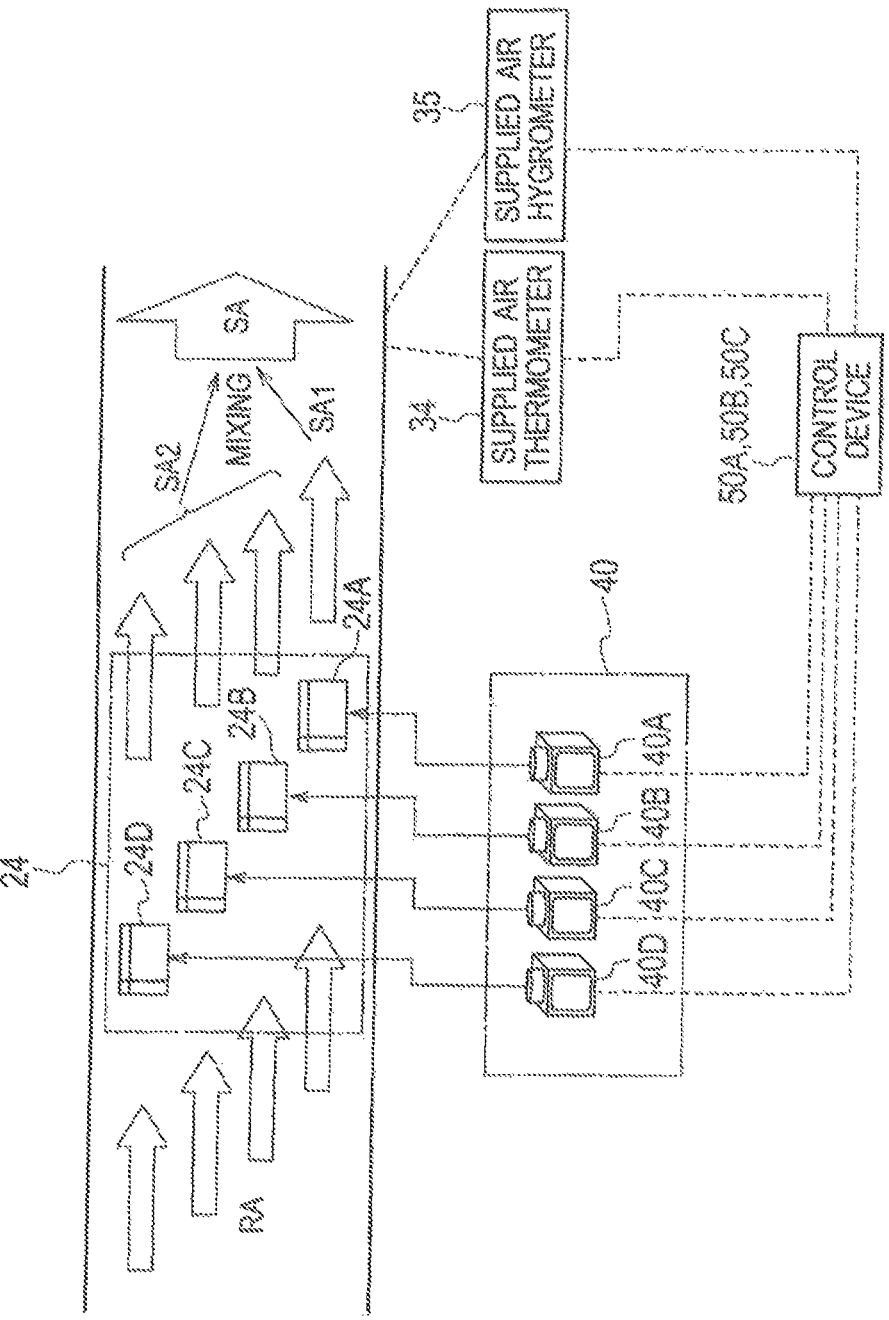
FIG. 7 is an explanatory view showing configurations of a cooling coil group and outdoor units in the air conditioning system according to the second embodiment.

A description is made of a configuration of a server room managing air conditioning system 1B according to a second embodiment of the present invention with reference to FIG. 7.

The air conditioning system 1B according to this embodiment has a similar configuration to that of the air conditioning system 1A according to the first embodiment except that a control device 50B is provided as shown in FIG. 7, and accordingly, a detailed description of devices having the same functions is omitted.

Figure 8:
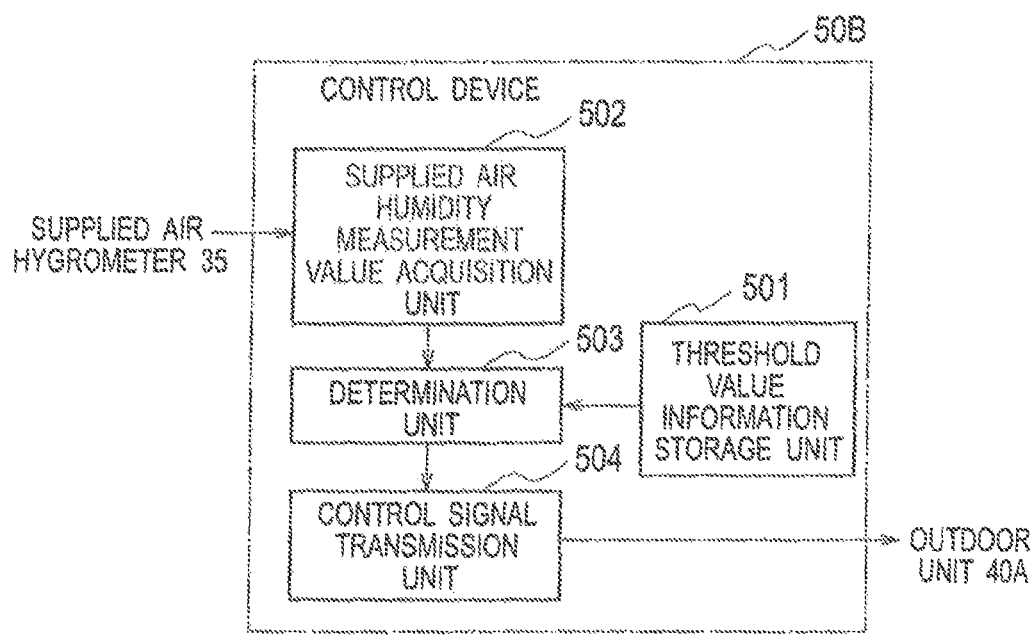
FIG. 8 is a block diagram showing a control device of the air conditioning system according to the second embodiment.

As shown in FIG. 8, the control device 50B includes: a threshold value information storage unit 501; a supplied air humidity measurement value acquisition unit 502; a determination unit 503; and a control signal transmission unit 504.

The threshold value information storage unit 501 stores information on an upper limit threshold value of the supplied air humidity measurement value for determining whether or not to execute the humidity control (for example, the upper limit threshold value is "absolute humidity: 0.0107 kg/kg" as an upper limit value of the humidity range of the region I) and on a lower limit threshold value therefor (for example, the lower limit threshold value is "absolute humidity: 0.0056 kg/kg" as a lower limit value of the humidity range of the region I).

The supplied air humidity measurement value acquisition unit 502 acquires the supplied sir humidity measurement value measured by the supplied air hygrometer 35.

The determination unit 503 determines whether or not the supplied air humidity measurement value acquired by the supplied air humidity measurement value acquisition unit 502 is within a range between the upper limit threshold value and the lower limit threshold value, which are stored in the threshold value information storage unit 501.

In the case where it is determined in the determination unit 503 that the supplied air humidity measurement value exceeds the upper limit threshold value, the control signal transmission unit 504 turns, to an ON state, the cooling coil 24A set as the first coil, transmits a control signal for starting an operation to the outdoor unit 40A corresponding thereto, and allows the outdoor unit 40A concerned to execute the humidity control. Moreover, in the case where the supplied air humidity measurement value thus acquired falls down below the preset lower limit threshold value, the control signal transmission unit 504 turns, to an OFF state, the cooling coil 24A set as the first coil, transmits a control signal for stopping the operation to the outdoor unit 40A corresponding thereto, and allows the outdoor unit 40A concerned to stop the humidity control.

(Operations of Server Room Managing Air Conditioning System According to Second Embodiment)

Next, a description is made of operations of the server room managing air conditioning system 1B according to this embodiment.

When the air conditioning system 1B operates in this embodiment, the supplied air humidity measurement value measured by the supplied air hygrometer 35 is acquired in the supplied air humidity measurement value acquisition unit 502 of the control device 50B.

Next, in the determination unit 503, it is determined whether or not the supplied air humidity measurement value acquired by the supplied air humidity measurement value acquisition unit 502 is within the range between the upper limit threshold value and the lower limit threshold value, which are stored in the threshold value information storage unit 501. As a result of the determination, in the case where it is determined that the supplied air humidity measurement value thus acquired exceeds the upper limit threshold value prestored in the threshold value information storage unit, it is decided that the cooling coil 24A be turned to the ON state, and in the case where it is determined that the supplied air humidity measurement value thus acquired falls down below the lower limit threshold value thus stored, it is decided that the cooling coil 24A be turned to the OFF state.

When it is decided in the determination unit 503 that the cooling coil 24A be turned to the ON state, the control signal for starting the operation of the outdoor unit 40A corresponding to the cooling coil 24A is transmitted from the control signal transmission unit 504 to the outdoor unit 40A, and when it is decided in the determination unit 503 that the cooling coil 24A foe turned to the OFF state, the control signal for stopping the operation of the outdoor unit 40A is transmitted from the control signal transmission unit 504 to the outdoor unit 40A.

Figure 9:
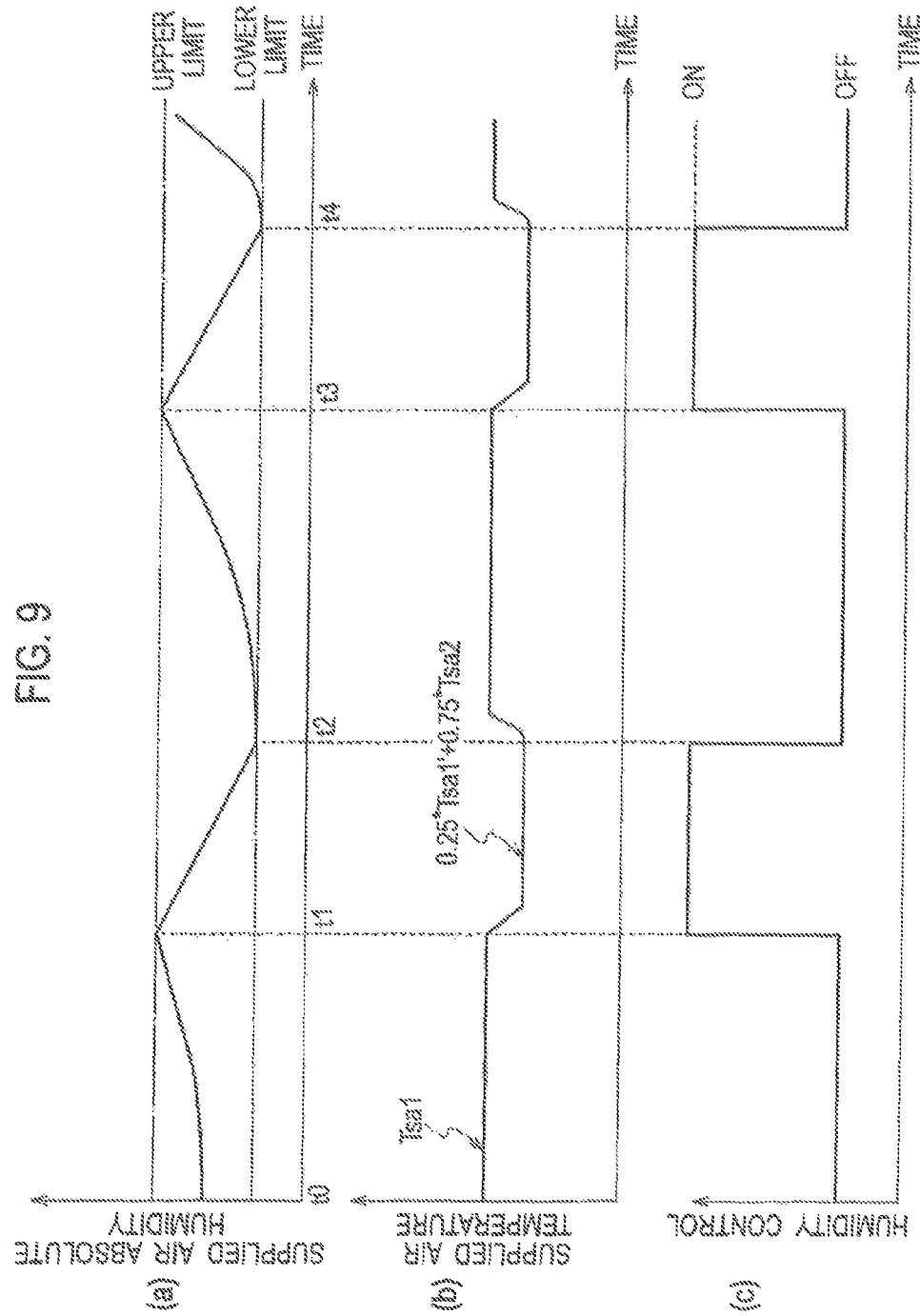
FIG. 9 is a graph when the air conditioning system according to the second embodiment operates.

FIG. 9 shows a relationship among: (a) a change of the supplied air absolute humidity value; (b) a change of the supplied air temperature value; and (c) an ON/OFF switching state of the humidity control, when the operation of the outdoor unit 40A is controlled as described above, and ON/OFF of the cooling coil 24A are thereby controlled.

As shown in FIG. 9, first, during a period (period from time t0 to time t1) from when the measurement is started until when the supplied air humidity measurement value reaches the upper limit threshold value, the absolute humidity of the server room 10 is within the appropriate range between the upper limit threshold value and the lower limit threshold value, the humidity control is in the OFF state, and the operation of the outdoor unit 40A is stopped by the control of the control device 50. At this time, with regard to the air conditioning control for the returned air acquired from the server room 10, only the temperature control is executed by the cooling coils 24B to 24D as the second coils based on the supplied air temperature measurement value acquired from the supplied air thermometer 34, and supplied air at temperature (Tsa1) within the target temperature range (for example, "temperature: 18° C. or more to 27° C. or less" as the temperature range of the region I) is generated.

Next, when the supplied air humidity measurement value rises and reaches the upper limit threshold value owing to the entrance of the outside air from the gap, and the like during the air conditioning control (at the time t1), then it is decided by the control device 50 that the humidity control be shifted to the ON state, and the control signal for operating the outdoor unit 40A is transmitted thereto. Then, the outdoor unit 40A is operated by this control signal, and the supply of the refrigerant of predetermined temperature and amount to the cooling coil 24A is started.

After the humidity control is shifted to the ON state, during a period (period from time t1 to time t2) until when the supplied air humidity measurement value reaches the lower limit threshold value, the humidity control is continuously executed, and in a similar way to the case described in the first embodiment, the outdoor units 40A to 40D are controlled by the control device 50 so that supplied air at lower temperature (Tsa1') than the supplied air temperature target value can be prepared in the cooling coil 24A, and that supplied air at higher temperature (Tsa2) than the supplied air temperature target value can be prepared in the cooling coils 24B to 24D.

The humidity control is started as described above, whereby the supplied air humidity measurement value starts to drop. Moreover, since the supplied air prepared in the cooling coil 24A is of the low temperature (Tsa1'), the temperature of the supplied air supplied to the server room drops within the target temperature range by being affected by this supplied air of the low temperature. Specifically, the cooling coil 24A that, performs the humidity control is one, meanwhile, the cooling coils 24B to 24D which perform the temperature control are three, and the temperature (Tsa) of the supplied air supplied to the server room 10 is represented by the following Expression (8).

[Math. 8]

$$Tsa = 0.25 \times Tsa1' + 0.75 Tsa2 \quad (8)$$

Next, when the supplied air humidity measurement value reaches the lower limit threshold value (time t2) because the humidity control is executed continuously, it is decided by the control device 50 that the humidity control be shifted to the OFF state, and the control signal for stopping the operation of the outdoor unit 40A is transmitted thereto. Then, the operation of the outdoor unit 40A is stopped.

Thereafter, when the supplied air humidity measurement value reaches the upper limit threshold value again (time t3) owing to the entrance of the outside air, and the like, then it is decided by the control device 50 that the humidity control be shifted to the ON state, and similar treatment is repeated.

In accordance with this embodiment described above, based on the supplied air temperature measurement value and supplied air humidity measurement value of the server room as the air conditioning control, subject, cooling volumes for the returned air by the respective cooling coils are decided so that the supplied air temperature and the supplied air humidity can remain within the target ranges. Therefore, variations of a humidity amount in the server room, which is increased more than expected, can also be coped with, and the supplied air with the target temperature value and the target humidity value can be supplied to the server room with higher accuracy.

Third Embodiment (Configuration of Server Room Managing Air Conditioning System According to Second Embodiment)

A server room managing air conditioning system 1C according to a third embodiment of the present invention has a similar configuration to that of the air conditioning system 1A according to the first embodiment except that a control device 50C is provided as shown in FIG. 7, and accordingly, a detailed description of devices having the same functions is omitted.

Figure 10:
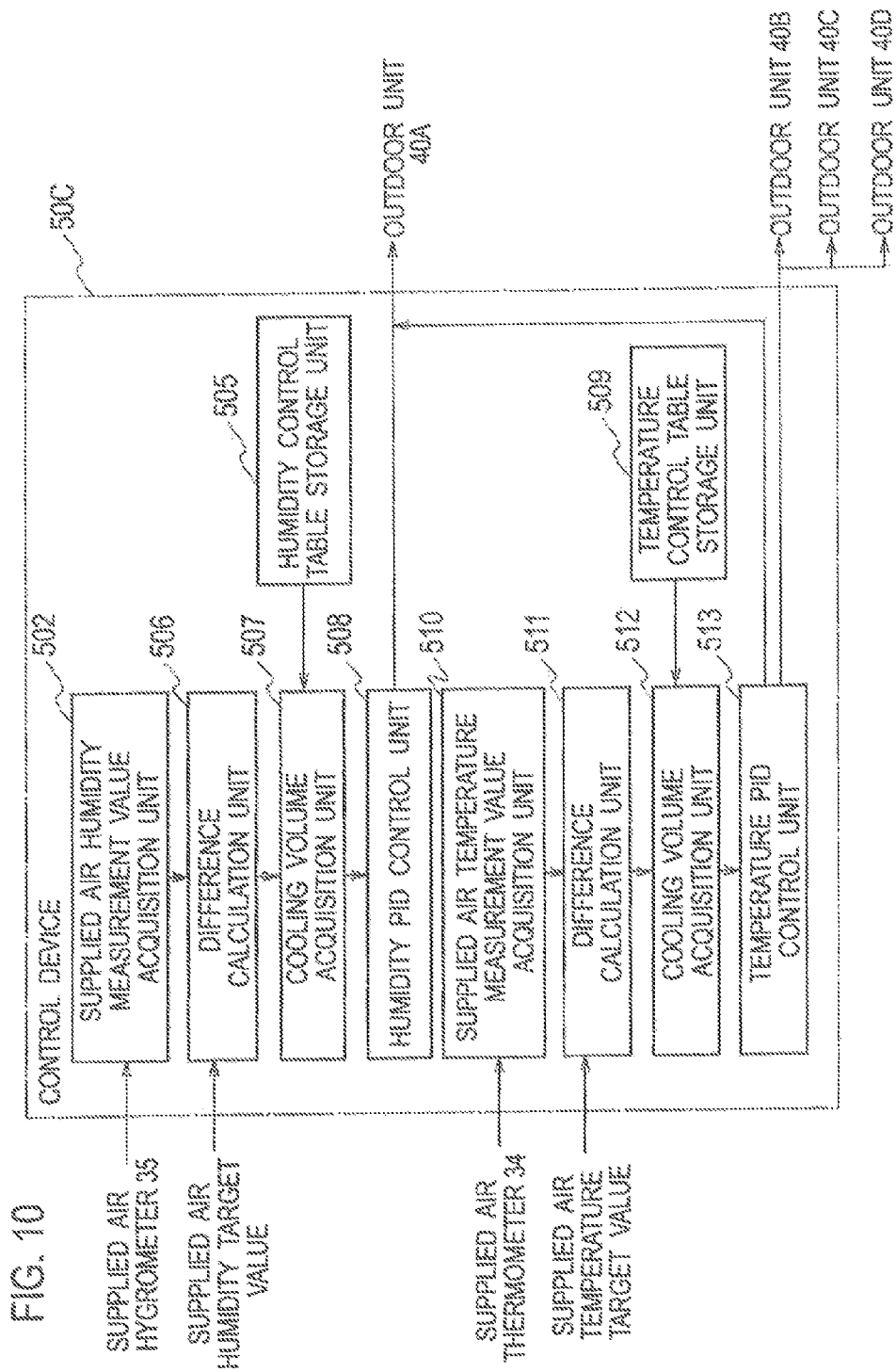
FIG. 10 is a block diagram showing a configuration of a control device of the air conditioning system according to the third embodiment.

The control device 50C performs PID control for the cooling coil group 24. As shown in FIG. 10, the control device 50C includes: a humidity control table storage unit 505; a supplied air humidity measurement value acquisition unit 502; a difference calculation unit 506; a cooling volume acquisition unit 507; a humidity PID control unit 508; a temperature control table storage unit 509; a supplied air temperature measurement value acquisition unit 510; a difference calculation unit 511; a cooling volume acquisition unit 512; and a temperature PID control unit 513.

The humidity control table storage unit 505 prestores a humidity control table indicating the cooling volumes for the returned air in the cooling coils for the humidity control for each difference between the supplied air humidity target value and the supplied air humidity measurement value.

The supplied air humidity measurement value acquisition unit 502 acquires the supplied air humidity measurement value measured by the supplied air hygrometer 35.

The difference calculation unit 506 calculates the difference between the preset supplied air humidity target value and the supplied air humidity measurement value acquired by the supplied air humidity measurement value acquisition unit 502.

The cooling volume acquisition unit 507 acquires the cooling volume for the returned air for humidity control, which corresponds to the difference calculated by the difference calculation unit 506, based on the humidity control table prestored in the humidity control table storage unit 505.

The humidity PID control unit 508 decides the temperature and amount of the refrigerant necessary for the humidity control based on the cooling volume for the returned air, which is for the humidity control and is acquired by the cooling volume acquisition unit 507, and thereby controls the operation of the outdoor unit 40A.

The temperature control table storage unit 509 prestores a temperature control table indicating the cooling volumes for the returned air in the cooling coils for the temperature control for each difference between the supplied air temperature target value and the supplied air temperature measurement value.

The supplied air temperature measurement value acquisition unit 510 acquires the supplied air temperature measurement value measured by the supplied air thermometer 34.

The difference calculation unit 511 calculates the difference between the preset supplied air temperature target value and the supplied air temperature measurement value acquired by the supplied air temperature measurement value acquisition unit 510.

The cooling volume acquisition unit 512 acquires the cooling volume for the returned air for temperature control, which corresponds to the difference calculated by the difference calculation unit 511, based on the temperature control table prestored in the temperature control table storage unit 509.

The temperature PID control unit 513 decides the temperature and amount of the refrigerant necessary for the temperature control based on the cooling volume for the returned air, which is for the temperature control and is acquired by the cooling volume acquisition unit 512, and thereby controls the operations of the outdoor units 40A to 40D.

(Operations of Server Room Managing Air Conditioning System According to Third Embodiment)

Next, a description is made of operations of the server room managing air conditioning system 1C according to this embodiment.

In this embodiment, when the air conditioning system 1C operates, the cooling coil 24A and the outdoor unit 40A are always set in the ON state.

Then, the supplied air humidity measurement value measured by the supplied air hygrometer 35 is acquired in the supplied air humidity measurement value acquisition unit 502 of the control device 50C.

Next, in the difference calculation unit 506, the difference between the supplied air humidity measurement value acquired by the supplied air humidity measurement value acquisition unit 502 and the supplied air humidity target value thus prestored is calculated.

Next, in the cooling volume acquisition unit 507, the cooling volume for the returned air for the humidity control, which corresponds to the difference calculated in the difference calculation unit 506, is acquired based on the humidity control table prestored in the humidity control table storage unit 505.

Next, in the humidity PID control unit 508, the temperature and amount of the refrigerant necessary for the humidity control are decided based on the cooling volume for the returned air, which is for the humidity control and is acquired by the cooling volume acquisition unit 507, whereby the operation of the outdoor unit 40A is controlled. Here, with regard to the humidity control, the temperature and amount of the refrigerant are decided so that the supplied air at the lower temperature (Tsa1') than the supplied air temperature target value can be prepared in a similar way to the case described in the first embodiment.

Meanwhile, in the supplied air temperature measurement value acquisition unit 510, the supplied air temperature measurement value measured in the supplied air thermometer 34 is acquired.

Next, in the difference calculation unit 511, the difference between the supplied air temperature measurement value acquired by the supplied air temperature measurement value acquisition unit 510 and the supplied air temperature target value thus prestored is calculated.

Next, in the cooling volume acquisition unit 512, the cooling volume for the returned air for the temperature control, which corresponds to the difference calculated in the difference calculation unit 511, is acquired based on the temperature control table prestored in the temperature control table storage unit 509.

Next, in the temperature PID control unit 513, the temperature and amount of the refrigerant necessary for the temperature control are decided based on the cooling volume for the returned air, which is for the temperature control and is acquired by the cooling volume acquisition unit 512, whereby the operations of the outdoor units 40A to 40D are controlled. Here, with regard to the temperature control, the temperature and amount of the refrigerant are decided so that the supplied air at the higher temperature (Tsa2) than the supplied air temperature target value can be prepared in a similar way to the case described in the first embodiment.

Among them, to the information on the cooling volume for the returned air for the temperature control of the outdoor unit 40A, there is added the above-mentioned information on the cooling volume for the returned air for the humidity control, and the temperature and amount of the refrigerant are decided.

Figure 11:
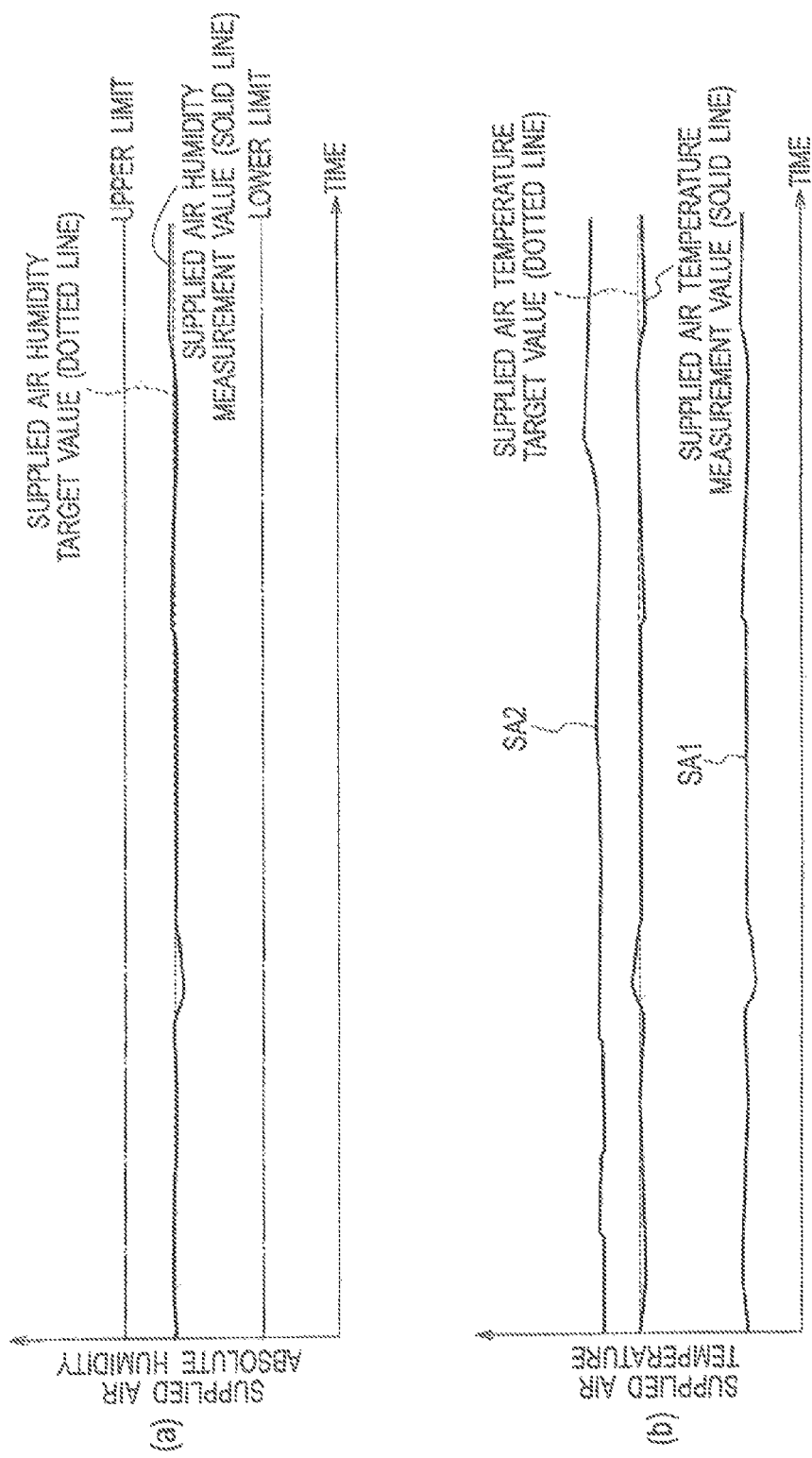
FIG. 11 is a graph when the air conditioning system according to the third embodiment operates.
Figure 12:
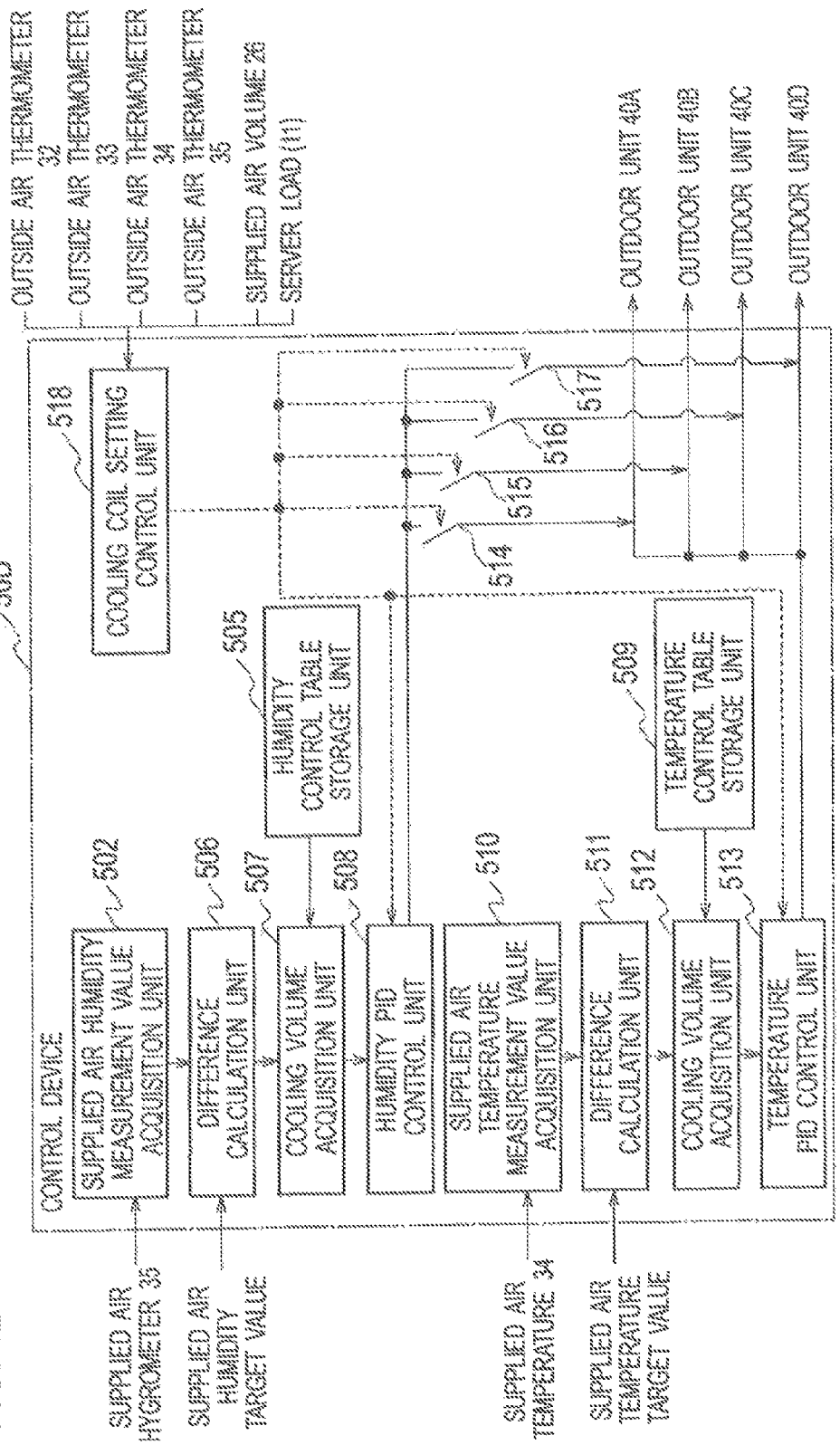
FIG. 12 is a block diagram showing a configuration of a control device of the air conditioning system according to the fourth embodiment.

FIG. 11 shows a relationship among: (a) a change of the supplied air absolute humidity value; (b) a change of the supplied air temperature value and (c) an ON/OFF switching state of the humidity control, when the operation of the outdoor unit 40A is controlled as described above.

In this embodiment, the control is executed, which corresponds to the differences between the target values and the supplied air humidity measurement value and the supplied air temperature measurement value, both of the measurement values being sequentially acquired by the PID control. Accordingly, as shown in FIGS. 11(*a*) and 11(*b*), both of the supplied air humidity measurement value and the supplied air temperature measurement value can be maintained in states close to constant states without being largely deviated from the target values.

In accordance with this embodiment described above, based on the supplied air temperature measurement value and supplied air humidity measurement value of the server room as the air conditioning control subject, the cooling volumes for the returned air by the respective cooling coils are decided so that the supplied air temperature and the supplied air humidity can be maintained in the states close to the constant states. Therefore, the variations of the humidity amount in the server room, which is increased more than expected, can also be coped with sequentially, and the supplied air with the target temperature value and the target humidity value can be supplied to the server room with higher accuracy.

Fourth Embodiment (Configuration of Server Room Managing Air Conditioning System According to Fourth Embodiment)

A server room managing air conditioning system 1D according to a fourth embodiment of the present invention has a similar configuration to that of the air conditioning system 1A according to the first embodiment except that a control device 50D is provided as shown in FIG. 7, and accordingly, a detailed description of devices having the same functions is omitted.

The air conditioning system 1D performs PID control for the cooling coil group 24. As shown in FIG. 10, the control device 50D includes: a humidity control table storage unit 505; a supplied air humidity measurement value acquisition unit 502; a difference calculation unit 506; a cooling volume acquisition unit 507; a humidity PID control unit 508; a temperature control table storage unit 509; a supplied air temperature measurement value acquisition unit 510; a difference calculation unit 511; a cooling volume acquisition unit 512; a temperature PID control unit 513; switches 514 to 517; and cooling coil setting control unit 518.

Among them, functions of the humidity control table storage unit 505, the supplied air humidity measurement value acquisition unit 502, the difference calculation unit 506, the cooling volume acquisition unit 507, the temperature control table storage unit 509, the supplied air temperature measurement value acquisition unit 510, the difference calculation unit 511 and the cooling volume acquisition unit 512 are the same as functions of the corresponding units of the control device 50B according to the third embodiment, and accordingly, a detailed description thereof is omitted.

The humidity PID control unit 508 decides the temperature and amount of the refrigerant necessary for the humidity control based on the cooling volume for the returned air, which is for the humidity control and is acquired by the cooling volume acquisition unit 507, and on control setting statuses of the cooling coils 24A to 24D, which are set by the cooling coil setting control unit 518 to be described later, and thereby controls the operations of the outdoor units 40A to 40D.

The temperature PID control unit 513 decides the temperature and amount of the refrigerant necessary for the temperature control based on the cooling volume for the returned air, which is for the temperature control and is acquired by the cooling volume acquisition unit 512, and on control setting statuses of the cooling coils 24A to 24D, which are set by the cooling coil setting control unit 518 to be described later, and thereby controls the operations of the outdoor units 40A to 40D.

The switch 514 is turned to the ON state, thereby connecting the humidity PID control unit 508 and the outdoor unit 40A to each other, and is turned to the OFF state, thereby disconnecting the connection between the PID control unit 508 and the outdoor unit 40A.

The switch 515 is turned to the ON state, thereby connecting the humidity PID control unit 508 and the outdoor unit 40B to each other, and is turned to the OFF state, thereby disconnecting the connection between the PID control unit 508 and the outdoor unit 40B.

The switch 516 is turned to the ON state, thereby connecting the humidity PID control unit 508 and the outdoor unit 40C to each other, and is turned to the OFF state, thereby disconnecting the connection between the PID control unit 508 and the outdoor unit 40C.

The switch 517 is turned to the ON state, thereby connecting the humidity PID control unit 508 and the outdoor unit 40D to each other, and is turned to the OFF state, thereby disconnecting the connection between the PID control unit 508 and the outdoor unit 40D.

The cooling coil setting control unit 518 acquires the measurement value measured by the outside air thermometer 32, the measurement value measured by the outside air thermometer 33, the measurement value measured by the supplied air thermometer 34, the measurement value measured by the supplied air hygrometer 35, a supplied air volume by the air supply fan 26, and load states of the servers housed in the server rack 11. Based on these pieces of information, the cooling coil setting control unit 518 makes a setting as to whether each of the cooling coils 24A to 24D is used for the humidity control or the temperature control. By this setting, the switch 514 is turned to the ON state at the time of making a setting that the cooling coil 24A is to be used for the humidity control, the switch 515 is turned to the ON state at the time of making a setting that the cooling coil 24B is to be used for the humidity control, the switch 516 is turned to the ON state at the time of making a setting that the cooling coil 24C is to be used for the humidity control, and the switch 517 is turned to the ON state at the time of making a setting that the cooling coil 24D is to be used for the humidity control.

(Operations of Server Room Managing Air Conditioning System According to Fourth Embodiment)

Next, a description is made of operations of the server room managing air conditioning system 1D according to this embodiment.

When the operation of the air conditioning system 1D is started in this embodiment, first, the measurement value measured by the outside air thermometer 32, the measurement value measured by the outside air thermometer 33, the measurement value measured by the supplied air thermometer 34, the measurement value measured by the supplied air hygrometer 35, the supplied air volume by the air supply fan 26, and the load states of the servers housed in the server rack 11 are acquired in the cooling coil setting control unit 518.

Then, based on these pieces of the acquired information, it is decided how many cooling coils in the cooling coil group 24 are to be used for the humidity control and how many cooling coils therein are to be used for the temperature control. In this embodiment, the cooling coil group 24 is composed of four cooling coils 24A to 24D, and therefore, these cooling coils can be allocated as those for use in the humidity control and those for use in the temperature control in a ratio of 1:3 or 2:2. A selection can be made from: a pattern (3:1) that the cooling coil 24A is used for the humidity control, and the cooling coils 24B to 24D are used for the temperature control; a pattern (2:2) that the cooling coils 24A and 24B are used for the humidity control and the cooling coils 24C and 24D are used for the temperature control; and a pattern (1:3) that the cooling coil 24A is used for the humidity control and the cooling coils 24B to 24D are used for the temperature control. In the event of making the selection of the pattern, a pattern in which energy consumption is the smallest is selected based on a result of a test performed in advance, whereby an energy saving effect can be enhanced.

When the number of cooling coils for use in the humidity control and the number of cooling coils for use in the temperature control are decided, then based on such decision, it is decided which cooling coils are to be used for the humidity control and which cooling coils are to be used for the temperature control.

At this time, a setting is made so that the cooling coil for use in the humidity control among the cooling coils 24A to 24D cannot be tilted toward a specific cooling coil, whereby a large load owing to the humidity control can be prevented from being applied only to specific cooing coil and outdoor unit, and an entire lifetime of the cooling coils 24A to 24D and the outdoor units 40A to 40D can be extended.

Here, by the cooling coil setting control unit 518, the switch corresponding to the outdoor unit connected to the cooling coil decided to perform the humidity control is tuned to the ON state, whereby the outdoor unit concerned is connected to the humidity PID control unit 508. In such a way, the information regarding the humidity control is transmitted from the humidity PID control unit 508 to the outdoor unit concerned.

Moreover, the control setting statuses of the cooling coils 24A to 24D, which are decided by the cooling coil setting control unit 518, are sent out to the humidity PID control unit 508 and the temperature PID control unit 513.

Meanwhile, in the supplied air humidity measurement value acquisition unit 502, the difference calculation unit 506 and the cooling volume acquisition unit 507, similar treatments to those in the case of the control device 50C according to the third embodiment are executed, and in the humidity PID control unit 508, the temperature and amount of the refrigerant necessary for the humidity control are decided based on the cooling volume for the returned air, which is for the humidity control and is acquired by the cooling volume acquisition unit 507, and on the control setting statuses of the cooling coils 24A to 24D, which are sent out from the cooling coil setting control unit 518, whereby the switch is turned to the ON state, and the operation of the outdoor unit 40 connected to the humidity PID control unit 508 is controlled.

Moreover, in the supplied air temperature measurement value acquisition unit 510, the difference calculation unit 511 and the cooling volume acquisition unit 512, similar treatments to those in the case of the control device 50C according to the third embodiment are executed, and in the humidity PID control unit 513, the temperature and amount of the refrigerant necessary for the temperature control are decided based on the cooling volume for the returned air, which is for the temperature control and is acquired by the cooling volume acquisition unit 512, and on the control setting statuses of the cooling coils 24A to 24D, which are sent out from the cooling coil setting control unit 518, whereby the operations of the outdoor units 40A to 40D are controlled.

At this time, in the control of the outdoor unit, which corresponds to the humidity control, the above-mentioned information on the cooling volume for the returned air for the humidity control is added to the information on the cooling volume for the returned air for the temperature control, and the temperature and amount of the refrigerant are decided.

Moreover, even among the plurality of cooling coils which perform the humidity control and the temperature control, it is also possible to set different cooling volumes. The supplied air finally mixed after being cooled by these cooling coils 24A to 24D just needs to attain a balance as a whole so as to achieve the supplied air humidity target value and the supplied air temperature target value.

In accordance with this embodiment described above, based on the supplied air temperature measurement value and supplied air humidity measurement value of the server room as the air conditioning control subject, the cooling volumes for the returned air by the respective cooling coils are decided so that the supplied air temperature and the supplied air humidity can be maintained in the states close to the constant states. Therefore, the variations of the humidity amount in the server room, which is increased more than expected, can also be coped with sequentially, and the supplied air with the target temperature value and the target humidity value can be supplied to the server room with high accuracy, and in addition, a higher energy saving effect can be obtained.

In the above first to third embodiments, the description has been made of the case where the cooling coil group is connected individually to the different outdoor units however, without being limited to this, a configuration may be adopted so that the plurality of cooling coils can be connected to one another, and can be managed as a group.

The description has been made of some embodiments of the present invention however, these embodiments are illustrated as examples, and do not intend to limit the scope of the invention. It is possible to embody these novel embodiments in other various forms, and for the embodiments, varieties of omissions, substitutions and alterations can be performed within the scope without departing from the spirit of the invention. These embodiments and modifications thereof are incorporated in the scope and spirit of the invention, and in addition, are incorporated in inventions described in the scope of claims and a range of equilibrium thereof.

The invention claimed is:

1. A server room management air conditioning system in which the air conditioning system performs an air conditioning of the server room in an all circulation mode in which outside air is not introduced but supplied air is manufactured by an action of returned air and supplied to the server room, the server room management air conditioning system comprising:
 a plurality of cooling coils which adjust the returned air of the server room;
 an air supply fan which mixes the supplied air adjusted by the plurality of cooling coils to supply as the supplied air to the server room;
 a first control device which obtains an outside air temperature measurement value, an outside air humidity measurement value, a supplied air temperature measurement value, a supplied air humidity measurement value, a supplied air volume, and a value that indicates load states of servers in the server room, and based on the obtained values,
 determines a number of the cooling coils among the plurality of cooling coils as first coils to be used for adjusting the returned air of the server room to a predetermined temperature value lower than a predetermined supplied air temperature target value to perform dehumidification, determines a number of the cooling coils among the plurality of cooling coils as second coils to be used for adjusting the returned air of the server to a predetermined temperature value higher than the supplied air temperature target value so as to adjust the returned air of the server room to the supplied air temperature target value and a predetermined supplied air humidity target value when the returned air is mixed with air adjusted by the first coils, and determines cooling coils to be used as the first coils and cooling coils to be used as the second coils so that the first coils are biased to specific cooling coils.

2. The server room management air conditioning system according to 1, further comprising:

a second control device which turns off the first coils when the supplied air humidity measurement value falls below a lower limit value of a supplied air humidity target range including the supplied air humidity target value and turns on the first coils when the supplied air humidity measurement value exceeds an upper limit value of the supplied air humidity target range.

3. The server room management air conditioning system according to claim 2, further comprising:

a second control device which determines a cooling volume for the returned air by the first coils so as to minimize a difference between the supplied air humidity measurement value and the supplied air humidity target value.

4. The server room management air conditioning system according to claim 1, further comprising:

a second control device which determines a cooling volume for the returned air by the first coils so as to minimize a difference between the supplied air humidity measurement value and the supplied air humidity target value.

* * * * *